United States Patent
Linde et al.

(10) Patent No.: US 7,177,189 B2
(45) Date of Patent: Feb. 13, 2007

(54) MEMORY DEFECT DETECTION AND SELF-REPAIR TECHNIQUE

(75) Inventors: Reed A. Linde, El Dorado Hills, CA (US); Alec W. Smidt, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/791,188

(22) Filed: Mar. 1, 2004

(65) Prior Publication Data
US 2005/0190615 A1  Sep. 1, 2005

(51) Int. Cl.
*G11C 11/34* (2006.01)
(52) U.S. Cl. .................... 365/185.09; 365/200
(58) Field of Classification Search ............... 365/200, 365/185.09
See application file for complete search history.

(56) References Cited

U.S. PATENT DOCUMENTS

| | | | | |
|---|---|---|---|---|
| 5,153,880 | A * | 10/1992 | Owen et al. .................. | 714/710 |
| 5,615,154 | A | 3/1997 | Yamada et al. | |
| 5,729,152 | A * | 3/1998 | Leung et al. .................. | 326/21 |
| 5,809,556 | A | 9/1998 | Fujisawa et al. | |
| 6,219,280 | B1 * | 4/2001 | Naganawa .............. | 365/185.22 |
| 6,380,597 | B1 * | 4/2002 | Gudesen et al. ............ | 257/390 |
| 6,393,504 | B1 * | 5/2002 | Leung et al. ............... | 710/104 |
| 6,553,510 | B1 * | 4/2003 | Pekny .......................... | 714/6 |
| 6,847,574 | B2 * | 1/2005 | Santin ..................... | 365/225.7 |
| 6,868,022 | B2 * | 3/2005 | Scheuerlein et al. ........ | 365/201 |

FOREIGN PATENT DOCUMENTS

| | | |
|---|---|---|
| EP | 0392895 | 10/1990 |
| EP | 0686979 | 12/1995 |
| WO | WO 94/07211 | 3/1994 |

OTHER PUBLICATIONS

Renesas Date Sheet, 128M superAND Flash Memory (with internal sector management), Rev. 2.00, Aug. 26, 2003, 50 pages.
Renesas Date Sheet, 256M superAND Flash Memory (with internal sector management), Rev. 0.01, Aug. 28, 2003, 53 pages.

* cited by examiner

*Primary Examiner*—M. Tran
(74) *Attorney, Agent, or Firm*—Rita M. Wisor

(57) ABSTRACT

According to some embodiments, a memory device having multiple memory units includes one or more redundant memory units. Upon detection of an electrical characteristic indicating a failing memory unit, one of the redundant memory units is used to replace the failing memory unit. Detection of failing memory units may be via current, voltage and/or resistance monitoring. If the electrical characteristic monitored exceeds a predetermined threshold, a memory unit is considered failing. The failing memory unit is removed from further use. The redundant memory unit is programmed to be accessible at the memory address of the removed memory unit. Replacement occurs automatically (that is, without user intervention).

29 Claims, 4 Drawing Sheets

MEMORY DEFECT DETECTION AND SELF-REPAIR TECHNIQUE

BACKGROUND

Description of the Related Art

Flash memory provides a non-volatile fast-access storage medium that may be rewritten in-circuit after first erasing old data. A flash memory cell is a small memory unit utilizing, for example, a modified metal-oxide semiconductor (MOS) transistor structure. Electric charge is stored on an insulated gate positioned between the transistor's select gate and channel. The charge on the insulated gate modulates the transistor's threshold voltage (Vt), which is resolved into data states during read operations. The flash memory cell is electrically erasable.

A flash memory block is a grouping of flash memory cells that are individually addressable. Due to the characteristics of flash memory, data is erased in blocks, which are typically between 8 kilobytes (KB) and 256 KB in size. Once data has been written into a particular byte location, that data cannot be changed without first erasing the byte, which requires erasing the entire block in which the byte is located. An erase pulse may be applied to erase the block. A block may fail to erase completely and the erase pulse may be reapplied.

Unscreenable latent manufacturing defects may be introduced during device fabrication. These defects may eventually break down and cause shorts in the flash memory array during customer use causing, for example, block erase operations to fail. Current solutions attempt to minimize the density of these latent defects during silicon process development and in manufacturing. Current solutions can be costly and often result in only partial reduction of these defects.

BRIEF DESCRIPTION OF THE DRAWINGS

The present invention may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

According to some embodiments, a memory device having multiple memory units includes one or more redundant memory units. Upon detection of an electrical characteristic indicating a failing memory unit, one of the redundant memory units is used to replace the failing memory unit. Detection of failing memory units may be via current, voltage and/or resistance monitoring. If the electrical characteristic monitored exceeds a predetermined threshold, a memory unit is considered failing. The failing memory unit is removed from further use. The redundant memory unit is programmed to be accessible at the memory address of the removed memory unit. Replacement occurs automatically (that is, without user intervention).

In the following description, numerous specific details are set forth. However, it is understood that embodiments of the invention may be practiced without these specific details. In other instances, well-known methods, structures and techniques have not been shown in detail in order not to obscure an understanding of this description.

References to "one embodiment," "an embodiment," "example embodiment," "various embodiments," etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

Unless specifically stated otherwise, as apparent from the following discussions, it is appreciated that throughout the specification discussions utilizing terms such as "processing," "computing," "calculating," or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data from registers and/or memory to transform that electronic data into other electronic data that may be stored in registers and/or memory. A "computing platform" may comprise one or more processors.

Figure 1:
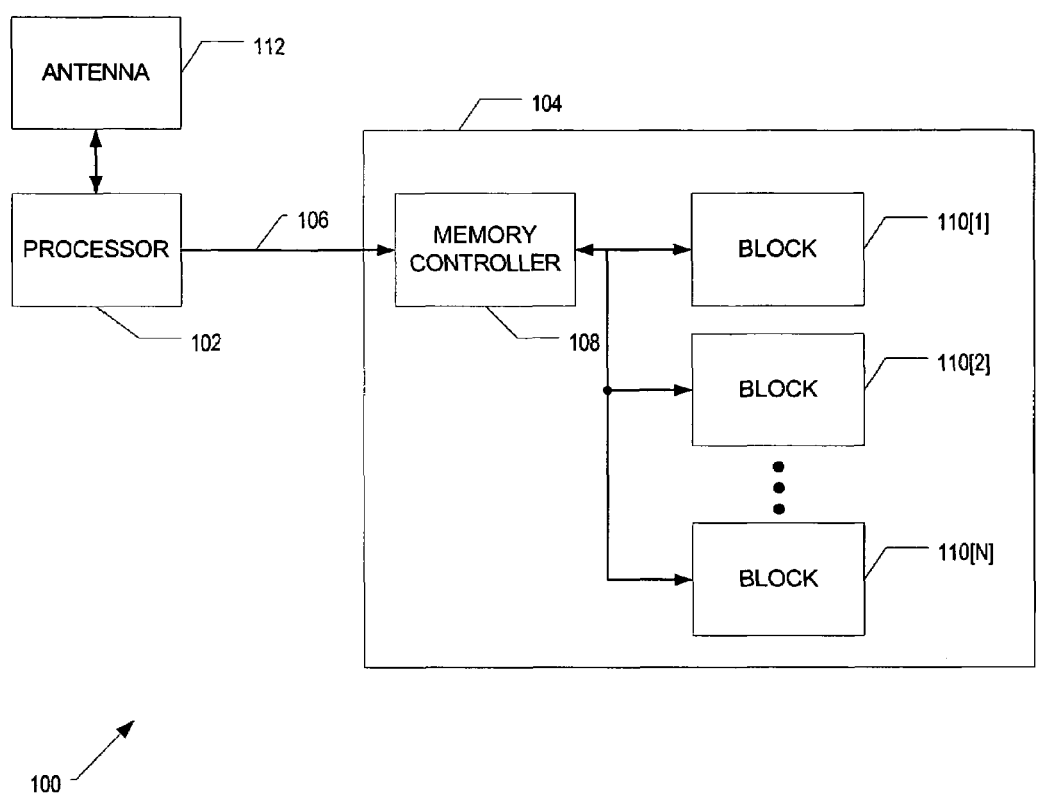
FIG. 1 illustrates a portion of a computing system according to an embodiment of the present invention.

FIG. 1 illustrates a portion of a computing system 100 according to an embodiment of the present invention. Processor 102 may issue commands and data to memory system 104 over bus 106. Memory controller 108 may receive the commands, store the address indicators, configure the control signals, and perform a block erase on selected ones of blocks 110(1)–(N). One or more of blocks 110 are not immediately addressable by memory controller 108. These un-addressable blocks are colloquially referred to as redundant blocks. A redundant memory block is available to replace any one of accessible blocks 110. When a failure is detected in an accessible block, a redundant block is automatically, that is, without user intervention, swapped for the failed block. Swapping may be performed, for example, by changing the access address of the redundant and failed blocks. The failed block becomes un-accessible and the redundant block becomes accessible at the address location of the failed block. Thus, redundant blocks are utilized to replace failing blocks, rather than allowing the product to fail.

Block replacement may occur during use of memory system 104 according to an embodiment of the present invention. In an alternative embodiment, block replacement may occur during manufacturing test to automate device repairs.

It should be understood that, in addition to block erase, there are various other commands that may be issued by processor 102 to memory system 104 over bus 106, such as Write Data, Read Data, Read Status, and the like. Most of these are not part of the invention, and in at least one embodiment may continue to operate in the conventional manner. Further, the detection of failure may be performed during these other commands as well as or instead of during block erase.

Memory system 104 may include, for example, FLASH memory, EEPROM, EPROM, ROM, ferromagnetic digital memory, phase-change memory, polymer memory, RAM, and/or the like.

Computing system 100 is intended to represent any number of computing and communication systems, including, but not limited to, mainframes, minicomputers, servers, workstations, personal computers, notepads, personal digital assistants, various wireless communication devices that may include one or more antenna(e) 112 and embedded systems, just to name a few.

Figure 2:
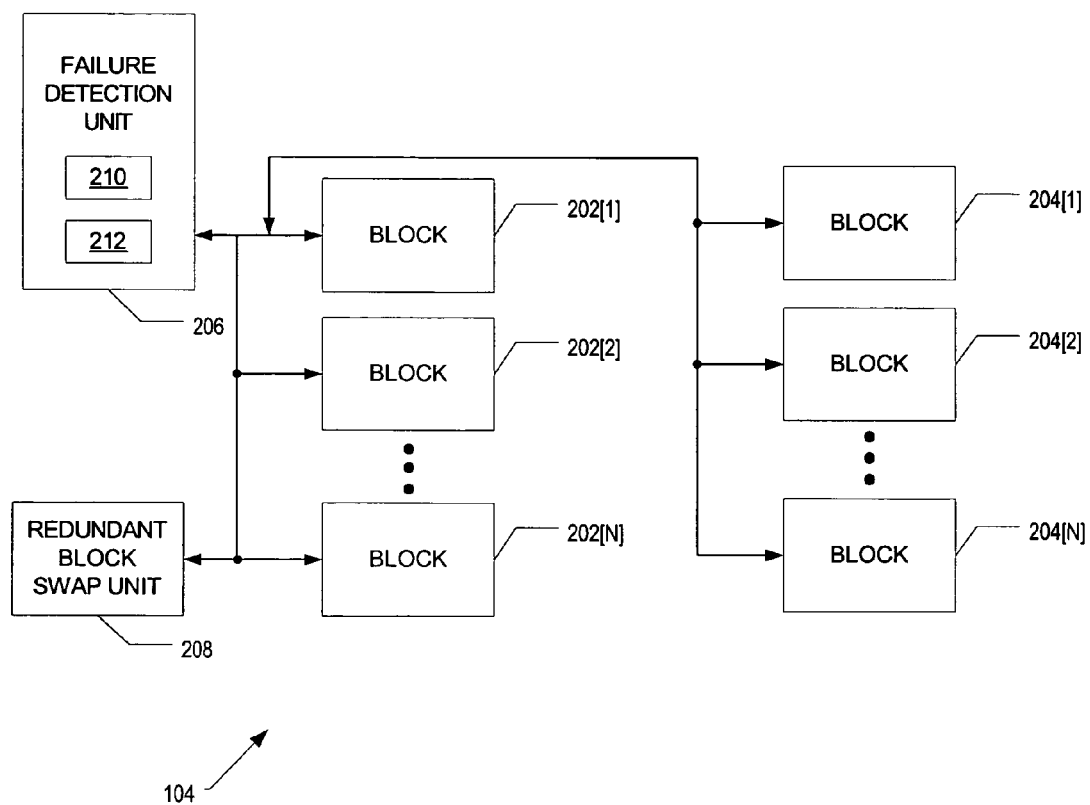
FIG. 2 illustrates a block diagram of a portion of memory system according to an embodiment of the present invention.

FIG. 2 illustrates a block diagram of a portion of memory system 104 according to an embodiment of the present invention. Memory system 104 includes multiple memory blocks 202(1)–(N), one or more redundant memory blocks 204(1)–(N), a failure detection unit 206 and a redundant block swap unit 208. Memory blocks 202 are currently addressable blocks. Redundant memory blocks 204 are not currently addressable blocks and may be in an erased state.

Failure detection unit 206 monitors memory blocks 202 for one or more electrical characteristics to identify failed blocks. Failure detection unit 206 may include circuitry 210 to test at least a subset of the memory blocks 202, for example, to test the current, voltage, and/or resistance of a memory block during operation, for example, during block erases. For example, currents may be detected on internal power supplies in use during memory block erase. Block erase failures are detected during the erase operation through the characteristic load on the internal power supplies of the system that occurs when the latent defects finally fail and become hard shorts. Any of a number of electrical characteristic monitoring circuits may be used and as such, need not be further discussed herein.

In one embodiment of the present invention, failure detection unit 206 may include circuitry 212 or may include a software/firmware routine(s) to count the number of failed erase attempts. After a threshold of failed erases attempts, for example, four, the block is determined to have a defect.

When a failure is detected during an erase operation, redundant block swap unit 208 automatically enables an available redundant block 204 and retires the failing block from further use. Both the output of failure detection unit 206 and the duration of the erase operation may be monitored during block erase.

Figure 3:
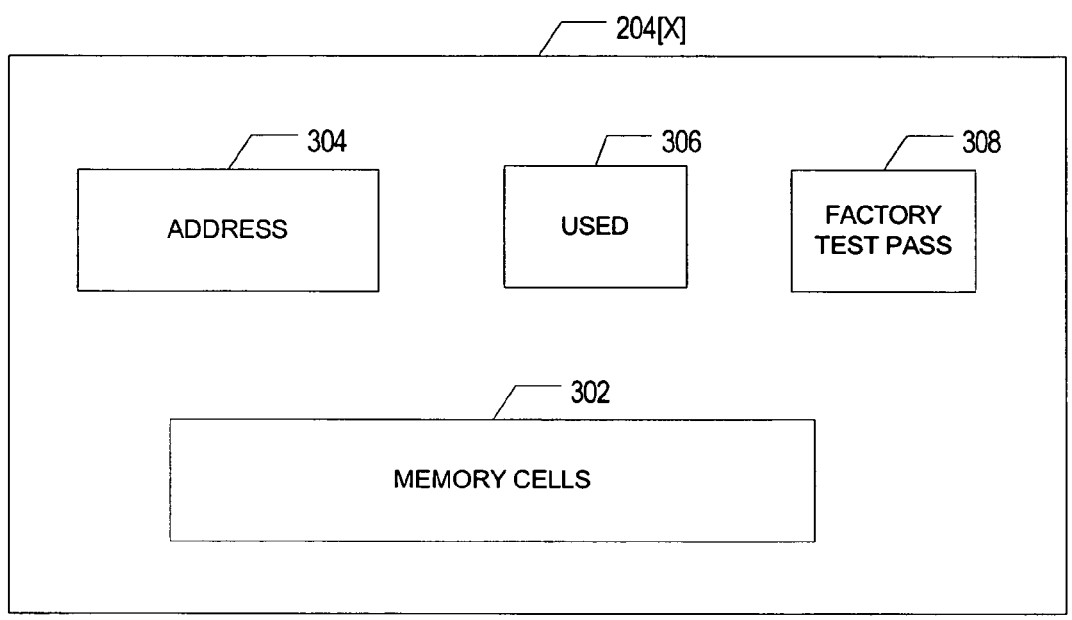
FIG. 3 illustrates portions of a redundant memory block according to an embodiment of the present invention.

In one embodiment, microcode automatically enables failing block replacement with an unused redundant block by programming a set of redundant block non-volatile status bits (SEE FIG. 3).

Failure detection unit 206 and/or redundant block swap unit 208 may be part of memory controller 108. Alternatively, failure detection unit 206 and/or redundant block swap unit 208 may be software routines operating on processor 102 or memory controller 108 that are enabled upon the detection of a failed block.

Note that the variable identifier "N" is used in several instances in FIG. 2 and other figures (and subsequent use of other variables, such as "m," "x," "k," and others) to more simply designate the final element (e.g., memory block 202[N], redundant memory block 204[N], and so on) of a series of related or similar elements (e.g., memory blocks 202[1]–202[N], redundant memory blocks 204[1]–204[N], and so on). The repeated use of such variable identifiers is not meant to imply a correlation between the sizes of such series of elements. The use of such variable identifiers does not require that each series of elements have the same number of elements as another series delimited by the same variable identifier. Rather, in each instance of use, the variable identified by "N" (or "m," "x," "k," and others) may hold the same or a different value than other instances of the same variable identifier. For example, memory block 202[N] may be the tenth memory block in a series of flash memory blocks, whereas redundant memory block[N] may be the second redundant memory block is a series of redundant memory blocks.

FIG. 3 illustrates portions of a redundant memory block according to an embodiment of the present invention. A redundant memory block 204[X] includes an array of memory cells 302 and one or more sets of status bits, for example, address status bits 304, used status bit 306, and factory test pass status bit 308. The status bits are programmable devices, for example, FLASH memory cells, fuses, or the like. In an alternate embodiment, address status bits 304, used status bit 306, and/or factory test pass status bit 308 are coupled to redundant memory block 204[X] and not necessarily within redundant memory block 204[X].

Address status bits 304 may be used to store the address of a failed memory block, that is, the failed memory block for which redundant memory block 204[X] is replacing. In the event of memory block erase failure, address status bits 304 may be programmed automatically, for example, by microcode.

Used status bit 306 may be used to record whether redundant memory block 204[X] has been put into use. Used status bit 306 may be programmed to indicate that redundant block swap unit 208 has swapped redundant memory block 204[X] with the failed block, or that the redundant block has been previously used for repair, for example, during manufacturing test.

Factory test pass status bit 308 may be used to indicate whether or not redundant memory block 204[X] passed testing during manufacturing. Factory test pass status bit 308 may be checked by microcode to determine if the unused redundant memory block is functional before it is used to replace a failing block.

According to one embodiment of the present invention, one or more redundant blocks may be used to replace a block that fails for reasons other than block erase failure. For example, any detected shorts or write failures may utilize block replacement.

Figure 4:
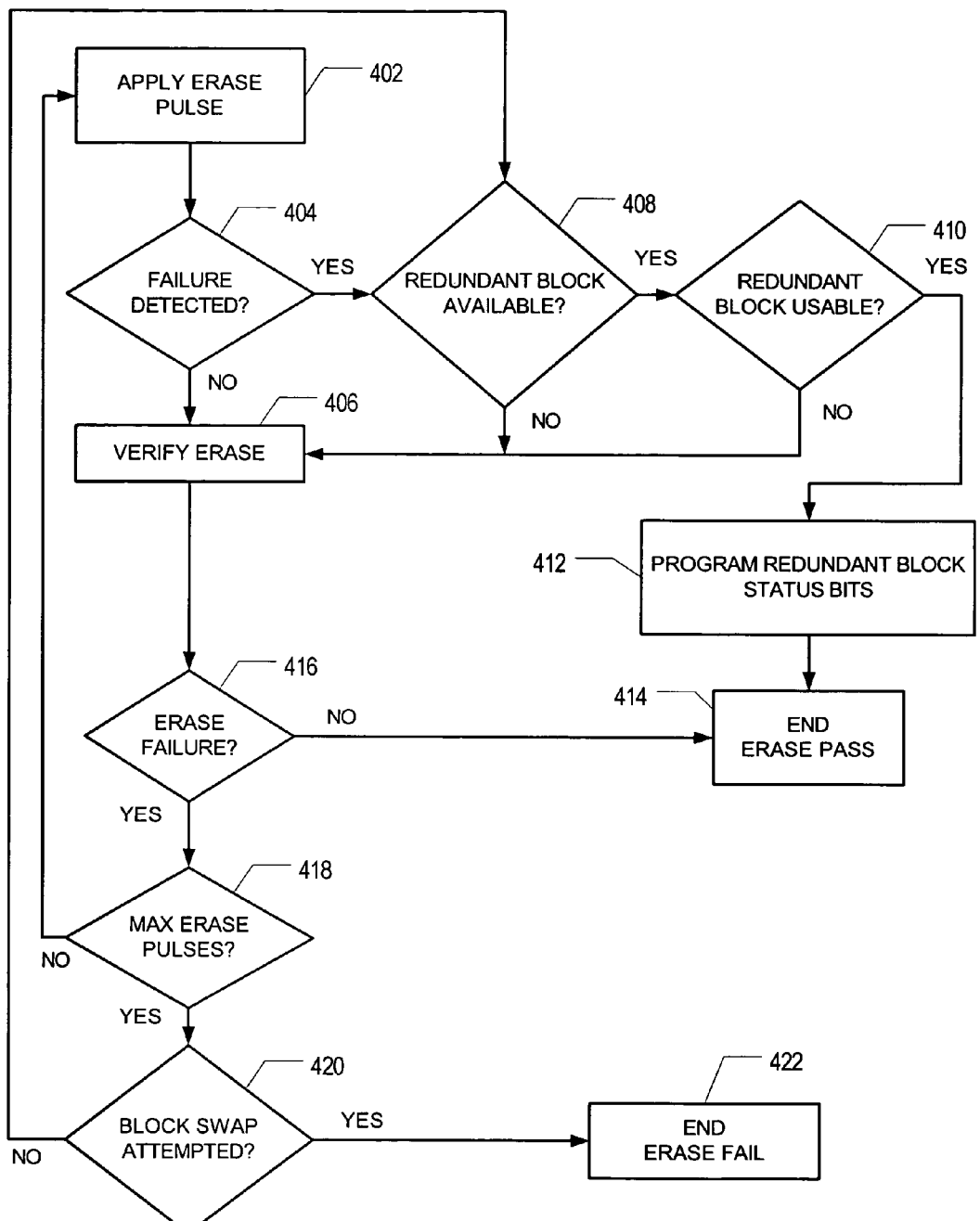
FIG. 4 illustrates a redundant block swap flow diagram according to an embodiment of the present invention.

FIG. 4 illustrates a redundant block swap flow diagram according to an embodiment of the present invention. An erase pulse is applied, 402. A determination is made whether a failure is detected, 404. For example, results of a current, voltage, and/or resistance test may be verified. If a failure is not detected, the erase is verified, for example, by reading the block, 406. If a failure is detected, a determination is made if there are any redundant blocks available, 408. A redundant block is available, for example, if the used status bit is not set. If a redundant block is not available, the erase is verified, 406. If a redundant block is available, a determination is made whether the redundant block is usable, 410. A redundant block is usable, for example, if the factory test pass status bit is set. If the redundant block is not usable, the erase is verified, 406. If the redundant block is usable, the failing block is replaced with the redundant block by programming, for example, the redundant block status bits, 412. For example, the address status bits and the used status bit may be programmed. After the block replacement, the process ends with an erase pass condition, 414. After verifying the erase, 406, a determination is made whether the erase failed, 416. If the erase did not fail, the process ends with an erase pass condition, 414. If the erase failed, a determination is made whether the maximum number of erase pulses have been applied, 418. If not, an additional erase pulse is applied, returning to 402. If the maximum number of erase pulses have been applied, a determination is made whether a block swapping has been attempted, 420. If not, the process goes to 408. If a block replacement has already been attempted, the process ends with an erase fail condition, 422.

In one alternate embodiment, in addition to or instead of determining whether the maximum number of erase pulses have been applied, 418, a determination may be made according to a measurement of the rate of erase after a fixed erase pulse count, for example, to determine whether the block is approaching the erased condition at the rate expected.

The operations referred to herein may be modules or portions of modules (e.g., software, firmware, or hardware modules). For example, the software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. For example, the determinations 408 and 410 may be combined into one determination, for example, a determination if a useable redundant block is available. Moreover, alternative embodiments may combine multiple instances of a particular module or sub-module. Furthermore, those skilled in the art will recognize that the operations described in various embodiments are for illustration only. Operations may be combined or the functionality of the operations may be distributed in additional operations in accordance with the invention.

Additionally, alternate embodiments may include functionally equivalent processes without deviating from the present invention. For example, instead of determining if a block swap has already been attempted, 420, a determination may be made whether a usable redundant block is available.

Various embodiments of the present invention may be implemented in circuitry or as a method. Embodiments of the present invention may also be implemented as instructions stored on a machine-readable medium, which may be read and executed by at least one processor to perform the functions described herein. A machine-readable medium includes any mechanism for storing or transmitting information in a form readable by a machine, for example, a computer. Computer readable media may be permanently, removably or remotely coupled to system 100 or another system. The computer readable media may include, for example and without limitation, any number of the following: magnetic storage media including disk and tape storage media; optical storage media such as compact disk media (e.g., CD-ROM, CD-R, etc.) and digital video disk storage media; holographic memory; nonvolatile memory storage media including semiconductor-based memory units such as FLASH memory, EEPROM, EPROM, ROM; ferromagnetic digital memories; phase-change memories; polymer memories; volatile storage media including registers, buffers or caches, main memory, RAM, etc.; and data transmission media including permanent and intermittent computer networks, point-to-point telecommunication equipment, carrier wave transmission media, the Internet, just to name a few. Other new and various types of computer-readable media may be used to store and/or transmit the software modules discussed herein.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

What is claimed is:

1. A method comprising:
   detecting an electrical characteristic identifying a defect in a memory unit; and
   replacing the memory unit with an alternate memory unit, wherein the replacing is performed during user operation of a device having the memory unit and the alternate memory unit;
   wherein the detecting is performed during an erase operation.

2. The method as recited in claim 1, wherein the detecting the electrical characteristic comprises:
   monitoring a current during an erase attempt; and
   identifying the defect when the current passes a predetermined current threshold.

3. The method as recited in claim 1, wherein the detecting the electrical characteristic comprises:
   monitoring a voltage during an erase attempt; and
   identifying the defect when the voltage passes a predetermined voltage threshold.

4. The method as recited in claim 1, wherein the detecting the electrical characteristic comprises:
   monitoring a resistance during an erase attempt; and
   identifying the defect when the resistance passes a predetermined resistance threshold.

5. The method as recited in claim 1, wherein the replacing the memory unit with the alternate memory unit comprises:
   causing the memory unit to be un-accessible at a memory address; and
   causing the alternate memory unit to be accessible at the memory address.

6. The method as recited in claim 5, wherein the causing the alternate memory unit to be accessible comprises:
   programming address status bits of the alternate memory unit with the memory address.

7. The method as recited in claim 6, wherein the address status bits comprise non-volatile memory.

8. The method as recited in claim 6, wherein the address status bits comprise programmable fuses.

9. The method as recited in claim 5, wherein the causing the alternate memory unit to be accessible comprises:
   setting a used status bit of the alternate memory unit.

10. The method as recited in claim 1, wherein the memory unit is a flash memory block.

11. The method as recited in claim 1, wherein the memory unit is a row of flash memory.

12. The method as recited in claim 1, wherein the memory unit is a row of polymer memory.

13. An apparatus comprising:
a plurality of accessible memory units;
one or more redundant memory units;
a failure detection unit coupled to the plurality of accessible memory units configured to monitor electrical characteristics in the plurality of accessible memory units during an erase operation and detect an electrical characteristic that identifies a defect in one of the plurality of accessible memory units; and
a redundant block swap unit coupled to the plurality of accessible memory units and the one or more redundant memory units, the redundant block swap unit configured to replace the one of the plurality of accessible memory units with one of the one or more redundant memory units.

14. The apparatus as recited in claim 13, the failure detection circuit comprising:
a current detection unit to detect a current during the erase operation.

15. The apparatus as recited in claim 13, the failure detection circuit comprising:
a voltage detection unit to detect a voltage during the erase operation.

16. The apparatus as recited in claim 13, the failure detection circuit comprising:
a resistance detection unit to detect a resistance during the erase operation.

17. The apparatus as recited in claim 13, wherein each of the one or more redundant memory units comprises:
a plurality of memory cells;
address status bits; and
a used status bit;
wherein the redundant block swap unit is configured to program the address status bits and the used status bit to cause the plurality of memory cells to be accessible.

18. The apparatus as recited in claim 13, wherein each of the one or more redundant memory units comprises a plurality of memory cells, the apparatus further comprising:
address status bits; and
a used status bit;
wherein the redundant block swap unit is configured to program the address status bits and the used status bit to cause the plurality of memory cells to be accessible.

19. A system comprising:
a processor;
an antenna coupled to the processor; and
a memory device coupled to the processor, the memory device comprising:
a plurality of accessible memory units;
one or more redundant memory units;
a failure detection unit coupled to the plurality of accessible memory units configured to monitor electrical characteristics in the plurality of accessible memory units and to detect a electrical characteristic that identifies a defect in one of the plurality of accessible memory units; and
a redundant block swap unit coupled to the accessible memory units and the one or more redundant memory units, the redundant block swap unit configured to replace the one of the plurality of accessible memory units with one of the one or more redundant memory units.

20. The system as recited in claim 19, the failure detection circuit comprising:
a current detection unit to detect a current in one of the plurality of accessible memory units during an erase operation.

21. The system as recited in claim 20, wherein each of the one or more redundant memory units comprises:
a plurality of memory cells;
address status bits; and
a used status bit;
wherein the redundant block swap unit is configured to program the address status bits and the used status bit to cause the plurality of memory cells to be accessible.

22. The system as recited in claim 19, wherein each of the one or more redundant memory units comprises a plurality of memory cells, the memory device further comprising:
address status bits; and
a used status bit;
wherein the redundant block swap unit is configured to program the address status bits and the used status bit to cause the plurality of memory cells to be accessible.

23. An apparatus comprising:
a computer readable medium; and
instructions stored on the computer readable medium to:
detect an electrical characteristic that identifies a defect in a memory unit; and
replace the memory unit with an alternate memory unit, wherein replacing is performed during user operation of a device having the memory unit and the alternate memory unit;
wherein the electrical characteristic is detected during an erase operation.

24. The apparatus as recited in claim 23, wherein the instructions to detect the electrical characteristic comprises instructions to:
monitor a current; and
identify a defect when the current exceeds a predetermined current threshold.

25. The apparatus as recited in claim 23, wherein the instructions to detect the electrical characteristic comprises instructions to:
monitor a voltage during an erase attempt; and
identify a defect when the voltage exceeds a predetermined voltage threshold.

26. The apparatus as recited in claim 23, wherein the instructions to replace the memory unit with an alternate memory unit comprises instructions to:
cause the memory unit to be un-accessible at a memory address; and
cause the alternate memory unit to be accessible at the memory address.

27. The apparatus as recited in claim 26, wherein the instructions to cause the alternate memory unit to be accessible comprises instructions to:
program address status bits of the alternate memory unit with the memory address.

28. The apparatus as recited in claim 26, wherein the instructions to cause the alternate memory unit to be accessible comprises instructions to:
set a used status bit of the alternate memory unit.

29. The apparatus as recited in claim 23, wherein the memory unit is a flash block.

* * * * *